US007219318B2

(12) United States Patent
Wu et al.

(10) Patent No.: US 7,219,318 B2
(45) Date of Patent: May 15, 2007

(54) SYSTEM AND METHOD FOR VERIFYING A LAYOUT OF CIRCUIT TRACES ON A MOTHERBOARD

(75) Inventors: Hao Wu, Shenzhen (CN); Jie Peng, Shenzhen (CN); Yu-Long Lin, Shenzhen (CN)

(73) Assignees: Hong Fu Jin Precision Industry (Shenzhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 293 days.

(21) Appl. No.: 10/977,823

(22) Filed: Oct. 29, 2004

(65) Prior Publication Data

US 2005/0262455 A1    Nov. 24, 2005

(30) Foreign Application Priority Data

May 21, 2004 (TW) ............... 93114416 A

(51) Int. Cl.
G06F 17/50    (2006.01)

(52) U.S. Cl. ............... 716/5; 716/13; 716/14
(58) Field of Classification Search ............ 716/5, 716/13, 14
See application file for complete search history.

(56) References Cited

U.S. PATENT DOCUMENTS

| | | | |
|---|---|---|---|
| 4,641,247 A * | 2/1987 | Laugesen et al. | 716/1 |
| 4,686,629 A * | 8/1987 | Noto et al. | 716/9 |
| 4,815,003 A * | 3/1989 | Putatunda et al. | 716/9 |
| 4,861,272 A * | 8/1989 | Clark | 439/79 |
| 5,198,986 A * | 3/1993 | Ikeda et al. | 716/5 |
| 5,404,313 A * | 4/1995 | Shiohara et al. | 716/14 |
| 5,535,134 A * | 7/1996 | Cohn et al. | 716/8 |
| 5,566,079 A * | 10/1996 | Jun et al. | 716/18 |
| 5,600,569 A * | 2/1997 | Nishiyama et al. | 716/1 |
| 5,831,864 A * | 11/1998 | Raghunathan et al. | 716/2 |

(Continued)

FOREIGN PATENT DOCUMENTS

JP    63204301 A *  8/1988

OTHER PUBLICATIONS

Watanabe et al., "A Hierarchical MCM Routing Using Four-Via Routing", IEEE Asia Pacific Conference on Circuits and Systems, Nov. 18, 1996, pp. 389-392.*

Primary Examiner—Phallaka Kik
(74) Attorney, Agent, or Firm—Morris Manning & Martin LLP; Tim Tingkang Xia, Esq.

(57) ABSTRACT

A system for verifying a layout of circuit traces on a motherboard includes a computer (1) and a database (2). The database is used for storing data generated and used by the system. The computer includes: a substandard layout area creating module (101) for creating substandard layout areas; a substandard segment data obtaining module (102) for obtaining from the database actual layout data on substandard segments placed in the substandard areas; a substandard length calculating module (103) for calculating a total length of all the substandard segments of a trace; and a satisfactory trace determining module (104) for comparing the total length of the substandard segments of the trace with a preset standard length for the trace, and determining whether the trace is satisfactory. A related method is also disclosed.

14 Claims, 4 Drawing Sheets

U.S. PATENT DOCUMENTS

| | | | |
|---|---|---|---|
| 6,067,409 A * | 5/2000 | Scepanovic et al. | 716/8 |
| 6,122,443 A * | 9/2000 | Nishikawa | 716/8 |
| 6,161,056 A * | 12/2000 | Sato | 700/193 |
| 6,222,739 B1 * | 4/2001 | Bhakta et al. | 361/790 |
| 6,223,328 B1 * | 4/2001 | Ito et al. | 716/6 |
| 6,295,634 B1 * | 9/2001 | Matsumoto | 716/12 |
| 6,327,693 B1 * | 12/2001 | Cheng et al. | 716/2 |
| 6,493,190 B1 * | 12/2002 | Coon | 360/245.9 |
| 6,560,505 B1 * | 5/2003 | Kikuchi et al. | 700/121 |
| 6,581,196 B2 | 6/2003 | Eisenberg et al. | |
| 6,643,839 B1 * | 11/2003 | Nishio et al. | 716/15 |
| 6,665,851 B1 * | 12/2003 | Donelly et al. | 716/8 |
| 6,988,256 B2 * | 1/2006 | Teig et al. | 716/7 |
| 7,024,419 B1 * | 4/2006 | Klenk et al. | 707/102 |
| 7,080,343 B2 * | 7/2006 | Asai et al. | 716/15 |
| 2001/0035799 A1 * | 11/2001 | Ueno et al. | 333/33 |
| 2002/0010898 A1 * | 1/2002 | Sasaki et al. | 716/1 |
| 2003/0167453 A1 * | 9/2003 | Smith et al. | 716/15 |
| 2003/0212978 A1 * | 11/2003 | Asai et al. | 716/15 |
| 2004/0040007 A1 * | 2/2004 | Harn | 716/11 |
| 2004/0088670 A1 * | 5/2004 | Stevens et al. | 716/13 |
| 2005/0170691 A1 * | 8/2005 | Mobley et al. | 439/540.1 |

* cited by examiner

SYSTEM AND METHOD FOR VERIFYING A LAYOUT OF CIRCUIT TRACES ON A MOTHERBOARD

BACKGROUND OF THE INVENTION

1. Field of the Invention

The present invention relates to systems and methods for verifying layouts of circuit traces on motherboards, and particularly to a system and method for verifying a layout of traces on a motherboard by determining whether the traces have been placed sufficiently distant from split planes of the motherboard.

2. Related Art of the Invention

A motherboard is made with an N-layer PCB (printed circuit board) on which electronic components must be properly positioned to reduce or eliminate electromagnetic interference (EMI). EMI is an electrical disturbance in an electronics-based system such as a computer system. EMI is caused by phenomena such as high-frequency waves emitted from integrated circuits and other electronic components. Standards have been established which stipulate the maximum EMI which a device is permitted to emit. These are known as electromagnetic compatibility (EMC) standards. In the United States, the Federal Communications Commission sets limits on the EMI output of electronic components. Other countries also set their own limits on the EMI output of electronic components. Therefore, when an engineer designs a PCB, he/she must ensure that EMI emissions coming from the circuits positioned on the PCB are at or below the maximum levels allowed in relevant jurisdictions.

A crowded PCB generally has a number of split planes distributed thereon, whereby the split planes can potentially interfere with the intended flow of electrical current. If a current encounters a split plane, the current is liable to be diverted to other areas of the PCB that are full of electrical devices and cause EMI. To reduce or eliminate EMI, EMC standards specify minimum distances between a circuit and the split planes. Therefore when an engineer designs a PCB, he/she must take the applicable minimum distance(s) into account, and lay out the circuits to be at least the applicable minimum distance(s) away from each split plane.

Once the layout is designed, it must be verified to insure that circuits have been properly placed in order to reduce EMI. Traditional methods of verifying the layout rely heavily on sheer manpower, and cannot precisely check the distances between the circuits and the split planes. These methods are time consuming, and do not always prevent motherboards with inexact layouts being produced. Thus, there is a need to provide a system and method which are able to not only (i) automatically verify the distances between circuits and split planes, but also (ii) reduce or even eliminate EMI that arises from said distances being too short.

SUMMARY OF THE INVENTION

Accordingly, a main objective of the present invention is to provide a system and method for verifying a layout of circuit traces on a motherboard, which can automatically determine whether any traces have been placed too close to split planes of the motherboard, and thereby determine whether or not such placement is likely to result in EMI.

To achieve the above objective, a system for verifying a layout of circuit traces on a motherboard (hereinafter "the system") is provided herein. The system comprises a computer, a database, and a connection connecting the computer with the database. The database comprises two logically separated storages: a standard layout data storage for storing a plurality of preset standard layout data on segments of traces and a preset standard length; and a actual layout data storage for storing actual layout data on the segments of the traces. The computer comprises: a substandard layout area creating module for creating substandard areas according the standard layout data and split planes next to a trace; a substandard segment data obtaining module for obtaining actual layout data on substandard segments placed in the substandard areas; a substandard length calculating module for calculating a length for each substandard segment of the trace, and adding up the lengths of the substandard segments of the trace to obtain a total length of the trace; and a satisfactory trace determining module for comparing the total length of substandard segments of the trace with the preset standard length, and determining whether the trace is satisfactory.

Further, the present invention provides a method for verifying a layout of a circuit trace on a motherboard, the method comprising the steps of: (a) obtaining preset standard layout data on segments of a trace and a preset standard length for the trace; (b) creating substandard areas according to the standard layout data on the trace and split planes next to the trace; (c) obtaining actual layout data on all substandard segments of the trace in the substandard areas; (d) calculating a length for each of the substandard segments; (e) adding up all the lengths of the substandard segments to obtain a total length; (f) determining whether the total length exceeds the preset standard length; and (g) generating a report about how to modify the trace if the total length exceeds the preset standard length.

These and other objects, advantages and novel features of the present invention will be drawn from the following detailed description of a preferred embodiment and method with reference to the appended drawings, in which:

DETAILED DESCRIPTION OF THE PREFERRED EMBODIMENT

Figure 1:
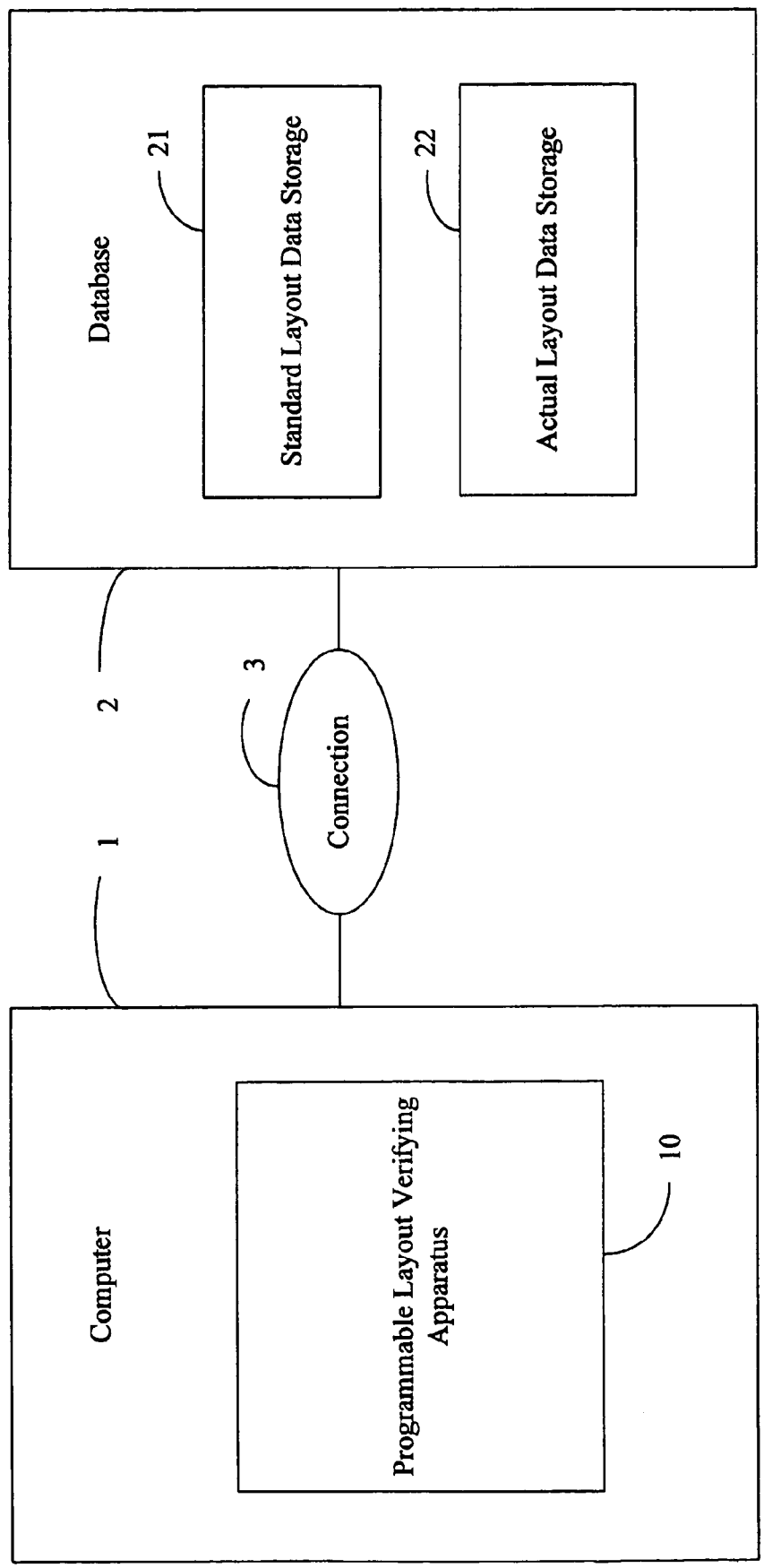
FIG. 1 is a schematic diagram of hardware infrastructure of a system for verifying a layout of circuit traces on a motherboard in accordance with the preferred embodiment of the present invention.

FIG. 1 is a schematic diagram of hardware infrastructure of a system for verifying a layout of circuit traces on a motherboard (hereinafter, "the system") in accordance with a preferred embodiment of the present invention. The system achieves its function of verifying the layout of traces on the motherboard by checking whether the traces have been placed sufficiently distant from split planes of the motherboard. If a distance between a trace and any of the split planes is shorter than a corresponding value (hereinafter referred to as "standard layout space"), the trace is regarded as being incorrectly placed. Commonly, a trace is constituted by a plurality of segments, each of which is assigned a unique identifier (ID). Therefore, verifying the layout of the traces can be realized by verifying the layout of the segments thereof.

The system comprises a computer 1, a database 2, and a connection 3 connecting the computer 1 with the database 2. The connection 3 is a database connectivity, such as an Open Database Connectivity (ODBC) or a Java Database Connectivity (JDBC). The database 2 is used for storing data used and generated by the system, and comprises two logically separated storages: a standard layout data storage 21, and an actual layout data storage 22. The standard layout data storage 21 is used for storing preset standard layout data on the segments of the traces and a preset standard length for each trace. The standard layout data on each segment include a standard layout space, a standard width, and standard start coordinate values and end coordinate values of the segment. The actual layout data storage 22 is used for storing actual layout data on the segments of the traces. The actual layout data on each segment includes an identifier (ID), a actual width, and actual start coordinate values and end coordinate values of the segment. The computer 1 comprises a programmable layout verifying apparatus 10, which can examine a layout of the traces on the motherboard to obtain actual layout data on substandard segments, calculate a total length for the substandard segments of each trace, and determine whether the total length of the substandard segments exceeds the preset standard length for the trace stored in the standard layout data storage 22.

Figure 2:
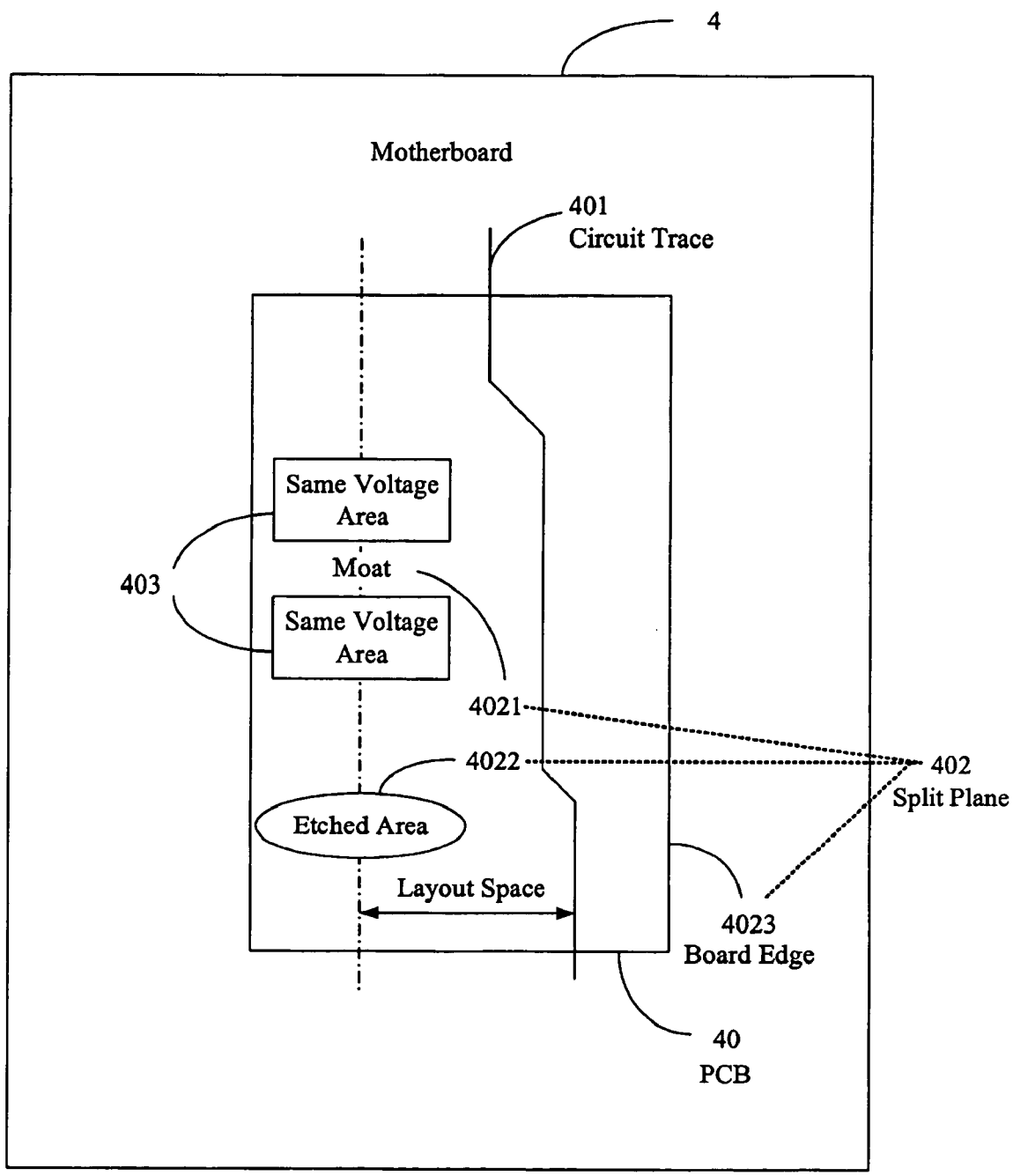
FIG. 2 is a schematic diagram illustrating a layout of a trace on a motherboard.

FIG. 2 is a schematic diagram illustrating a layout of a trace on a motherboard 4. The motherboard 4 comprises an N-layer printed circuit board (PCB) 40. A plurality of circuit traces 401, a plurality of split planes 402, and a plurality of areas 403 having a same voltage (hereinafter referred to as "same voltage areas 403") are distributed on the PCB 40. According to the preferred embodiment, the split planes 402 used herein include areas such as dielectric-filled moats 4021 between two same voltage areas 403, a plurality of etched areas 4022, and a board edge 4023. For simplicity, only one trace 401, two same voltage areas 403 and one etched area 4022 are shown in FIG. 2 and described hereinafter. Generally, to avoid EMI (electromagnetic interference), each segment of the trace 401 must be placed a minimum distance away from the split planes 402, the minimum distance being at least a distance of a standard layout space. If any segment is not so placed, the segment is considered as a substandard segment, and can be included in a substandard area.

Figure 3:
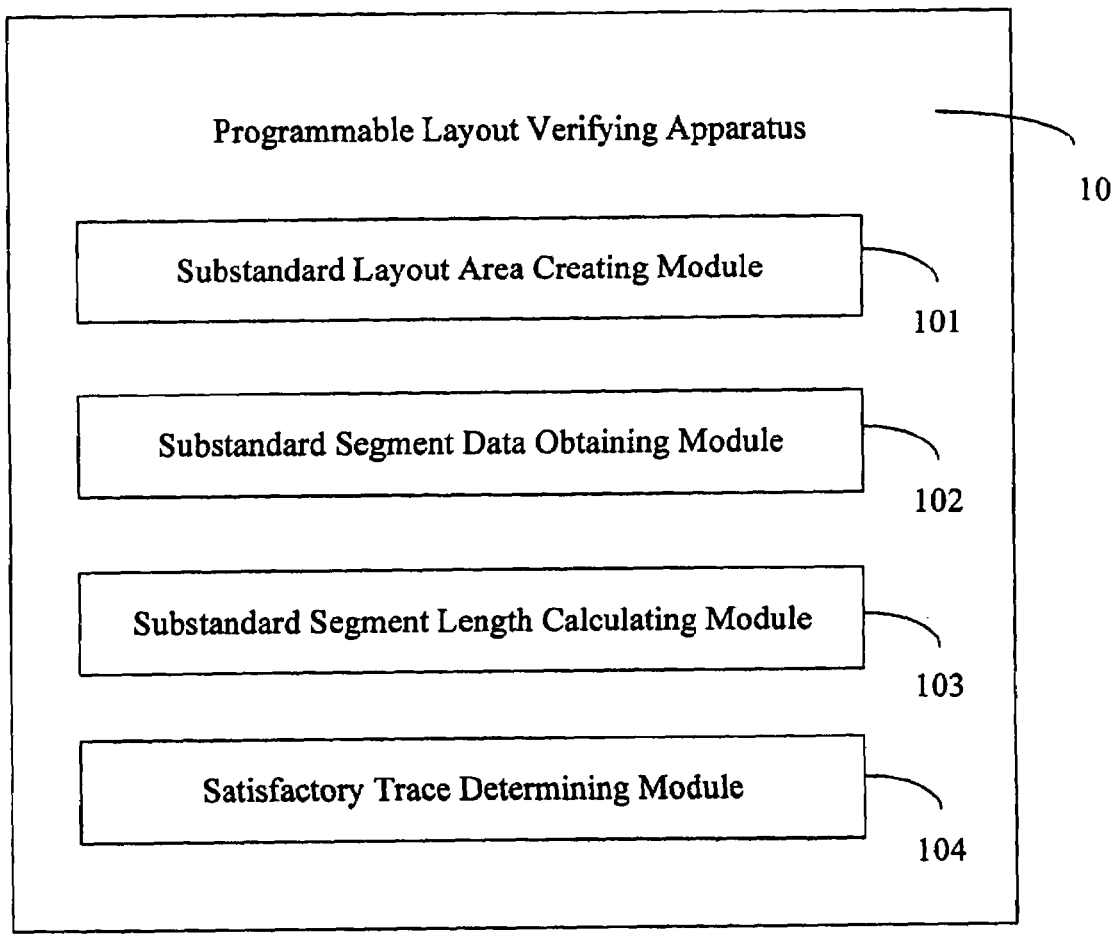
FIG. 3 is a schematic diagram of function modules of a programmable layout verifying apparatus of a computer of the system of FIG. 1.

FIG. 3 is a schematic diagram of function modules of the programmable layout verifying apparatus 10. The programmable layout verifying apparatus 10 comprises a substandard layout area creating module 101, a substandard segment data obtaining module 102, a substandard segment length calculating module 103, and a satisfactory trace determining module 104. The substandard layout area creating module 101 is used for creating substandard layout areas according to the standard layout data stored in the standard layout data storage 21 and split planes 402 next to a trace 401. The substandard segment data obtaining module 102 is for obtaining the actual layout data on substandard segments placed in the substandard areas of the trace 401. The substandard length calculating module 103 is for calculating a length for each substandard segment according to actual start coordinate values and end coordinate values of the substandard segment, and adding up all the lengths of the substandard segments to obtain a total length. The satisfactory trace determining module 104 is for determining whether the trace 401 is satisfactory, by comparing the total length of the substandard segments with a preset standard length. If the total length of the substandard segments is less than or equal to the preset standard length, the trace 401 is considered as satisfactory. Otherwise, the trace 401 is considered as unsatisfactory. If the trace 401 is unsatisfactory, the computer 1 generates a report about the unsatisfactory trace 401, advising designers how to modify the layout of the substandard segments.

Figure 4:
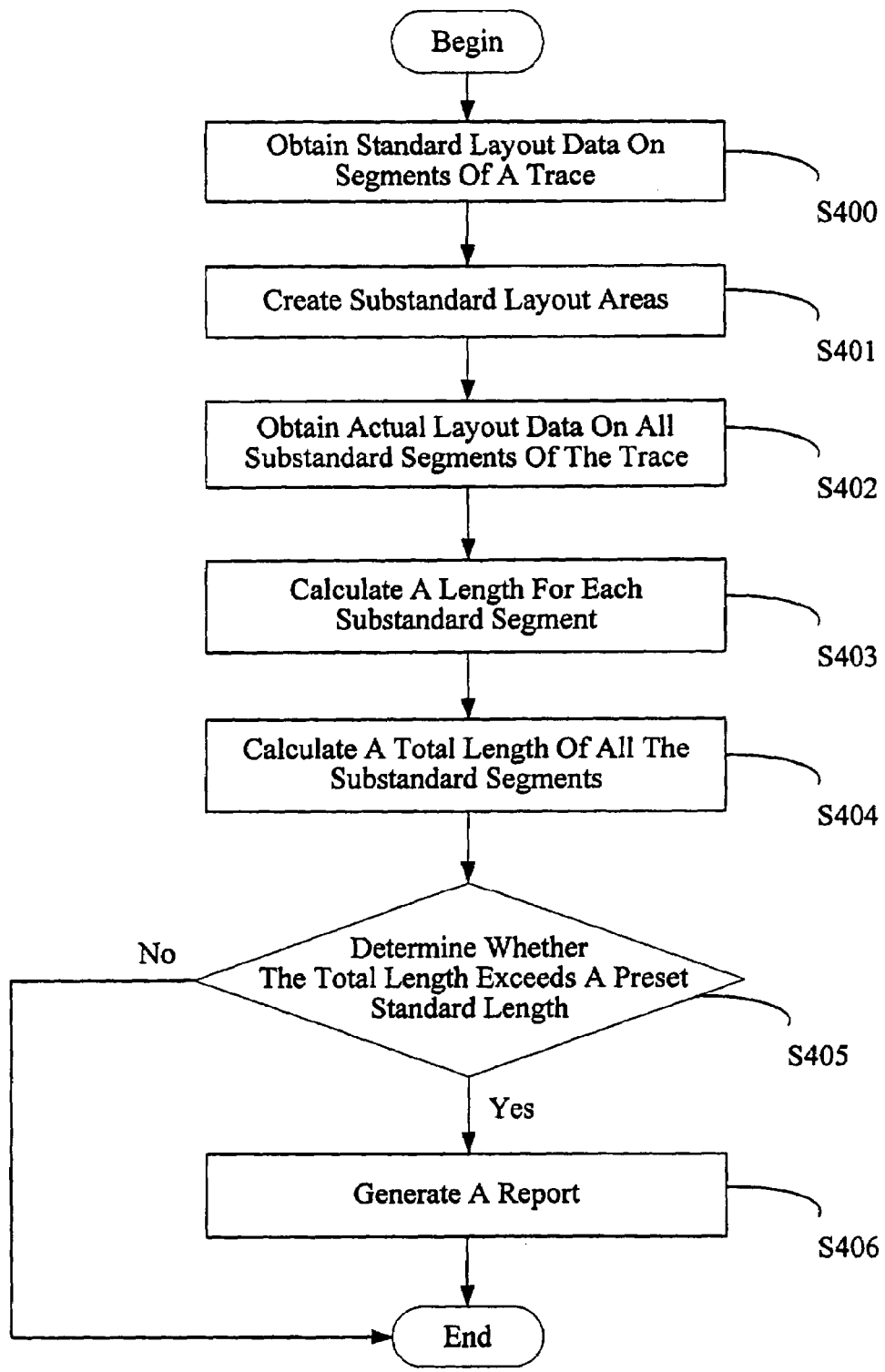
FIG. 4 is a flowchart of a preferred method of the present invention for verifying a layout of a circuit trace on a motherboard.

FIG. 4 is a flowchart of a preferred method for verifying a layout of a circuit trace 401 on the motherboard 4. In step S400, the substandard layout area creating module 101 obtains standard layout data on segments of the trace 401 from the standard layout data storage 21. In step S401, the substandard layout area creating module 101 creates substandard layout areas according to the standard layout data on the segments and split planes 402 next to the trace 401. In step S402, the substandard segment data obtaining module 102 obtains actual layout data on all the substandard segments of the trace 401 in the substandard layout areas, including an ID, a layout space, and actual start coordinate values and end coordinate values of each substandard segment. In step S403, the substandard length calculating module 103 calculates a length for each substandard segment according to the actual start coordinate values and the end coordinate values of the substandard segment. In step S404, the substandard length calculating module 103 calculates a total length of the substandard segments by adding up the lengths of all the substandard segments. In step S405, the satisfactory trace determining module 104 determines whether the total length of the substandard segments exceeds a preset standard length. If the total length of the substandard segments does not exceed the preset standard length, the trace 401 is satisfactory, and the procedure is finished. Otherwise, if the total length exceeds the standard length, the trace 401 is unsatisfactory, and in step S406, the computer 1 generates a report about the unsatisfactory trace 401. The report advises corresponding designers how to modify the layout of the substandard segments. The procedure is then finished.

Although the present invention has been specifically described on the basic of a preferred embodiment and a preferred method, the invention is not to be construed as being limited thereto. Various changes and modifications may be made to the embodiment and method without departing from the scope and the spirit of the invention.

What is claimed is:

1. A system for verifying a layout of traces on a motherboard, the system comprising a computer and a database connected to the computer, wherein:

the database comprises:
  a standard layout data storage for storing preset standard layout data on segments of the traces and a preset standard length for each of the traces; and
  an actual layout data storage for storing actual layout data on the segments of the traces; and the computer comprises:
  a substandard layout area creating module for creating substandard areas according to the standard layout data on the segments of the traces and split planes next to the traces;
  a substandard segment data obtaining module for obtaining actual layout data on substandard segments from the actual layout data storage, wherein the substandard segments are placed in the substandard areas;
  a substandard length calculating module for calculating a length for each substandard segment of each of the traces according to actual start coordinate values and end coordinate values of the substandard segments, and calculating a total length of the substandard segments of the trace by adding up all the lengths of the substandard segments; and a satisfactory trace determining module for determining whether each of the traces is satisfactory by comparing the total length of the substandard segments of the trace with the preset standard length for the trace.

2. The system according to claim 1, further comprising a connection connecting the computer with the database.

3. The system according to claim 1, wherein the preset standard layout data on each segment comprises a standard layout space, a standard layout width, and standard start coordinate values and end coordinate values of the segment.

4. The system according to claim 1, wherein the actual layout data on each segment comprises an identifier, an actual width, and actual start coordinate values and end coordinate values of the segment.

5. The system according to claim 1, wherein the motherboard comprises a printed circuit board (PCB) on which there are distributed a plurality of traces, a plurality of split planes, and a plurality of areas having a same voltage.

6. The system according to claim 5, wherein the split planes comprise dielectric-filled moats between the areas having a same voltage, etched areas, and board edges of the PCB.

7. The system according to claim 1, wherein the substandard layout area creating module creates the substandard areas when the segments of the traces respectively in the substandard areas are determined as the substandard segments if the segments are not placed away from any of the split planes in a distance of a standard layout space available from the standard layout data.

8. A computer-based method for verifying a layout of a trace on a motherboard, the method comprising the steps of:
obtaining standard layout data on segments of the trace and a preset standard length for the trace;
creating substandard areas according to the standard layout data on the segments of the trace and split planes next to the trace;
obtaining actual layout data on all substandard segments of the trace, wherein the substandard segments are placed in the substandard areas;
calculating a length for each of the substandard segments according to actual start coordinate values and end coordinate values of the substandard segments;
adding up all the lengths of the substandard segments to obtain a total length;
determining whether the total length exceeds the preset standard length; and
generating a report about how to modify the trace if the total length exceeds the preset standard length.

9. The method according to claim 8, wherein the standard layout data on each segment of the trace comprises a standard layout space, a standard layout width, and standard start coordinate values and end coordinate values of the segment.

10. The method according to claim 8, wherein the actual layout data on each segment of the trace comprises an identifier, an actual width, and actual start coordinate values and end coordinate values of the segment.

11. The method according to claim 8, further comprising a step of accepting the trace as a satisfactory trace if the total length of the substandard segments of the trace does not exceed the preset standard length.

12. The method according to claim 8, wherein the substandard areas are created when the segments of the trace respectively in the substandard areas are determined as the substandard segments if the segments are not placed away from any split plane in a distance of a standard layout space available from the standard layout data.

13. A method for verifying a trace layout of a circuit board, the method comprising the steps of:
providing standard layout data of said trace layout and a preset permissible total length value for said trace layout;
identifying substandard areas of said trace layout in comparison with said standard layout data when trace segments respectively in said substandard areas are determined as substandard segments if said trace segments are not placed away from any split plane in a distance of a standard layout space based on said standard layout data;
calculating a length for each of said substandard segments in said substandard areas according to actual start coordinate values and end coordinate values of said substandard segments;
adding up said length of said each substandard segment to obtain a total length; and
reporting how to modify said trace layout in case that said total length is larger than said permissible total length value.

14. The method according to claim 13, wherein said standard layout data comprises a standard layout space for said trace layout away from a split plane of said circuit board, a standard layout width of said trace layout, and standard start coordinate values and end coordinate values of a segment of said trace layout for identification in said identifying step.

* * * * *